United States Patent [19]
Laibowitz et al.

[11] Patent Number: 6,090,659
[45] Date of Patent: Jul. 18, 2000

[54] LEAD SILICATE BASED CAPACITOR STRUCTURES

[75] Inventors: Robert Benjamin Laibowitz; Thomas McCarroll Shaw, both of Peekskill, N.Y.

[73] Assignee: International Business Machines Corporation, Armonk, N.Y.

[21] Appl. No.: 09/314,409

[22] Filed: May 19, 1999

Related U.S. Application Data

[62] Division of application No. 08/431,349, Apr. 28, 1995.
[51] Int. Cl.⁷ .......................... H01L 29/76; H01L 29/94; H01L 31/062
[52] U.S. Cl. .......................... 438/240; 438/239; 257/295; 361/321.4
[58] Field of Search .................................. 257/277, 295; 438/239, 240, 238; 361/321.2, 321.3, 321.4, 321.5

[56] References Cited

U.S. PATENT DOCUMENTS

| | | | |
|---|---|---|---|
| 3,977,887 | 8/1976 | McIntosh | 106/46 |
| 4,772,985 | 9/1988 | Yasumoto et al. | 361/321 |
| 5,471,364 | 11/1995 | Summerfelt et al. | 361/321.4 |

FOREIGN PATENT DOCUMENTS 6-340472  12/1994  Japan.

*Primary Examiner*—Olik Chaudhuri
*Assistant Examiner*—Phat X. Cao
*Attorney, Agent, or Firm*—Robert M. Trepp

[57] ABSTRACT

A capacitor and method of making is described incorporating a semiconductor substrate, a bottom electrode formed on or in the substrate, a dielectric layer of barium or lead silicate, and a top electrode. A sandwich dielectric of a barium or lead silicate and a high dielectric constant material such as barium or lead titanate may comprise the dielectric. The silicate layer may be formed by evaporating and diffusing, ion implanting, or electroplating and diffusing barium or lead. The high epsilon dielectric constant material may be formed by sol gel deposition, metal organic chemical vapor deposition or sputtering. The invention overcomes the problem of a bottom electrode and dielectric layer which chemically interact to form a silicon oxide layer in series or below the desired dielectric layer.

3 Claims, 4 Drawing Sheets

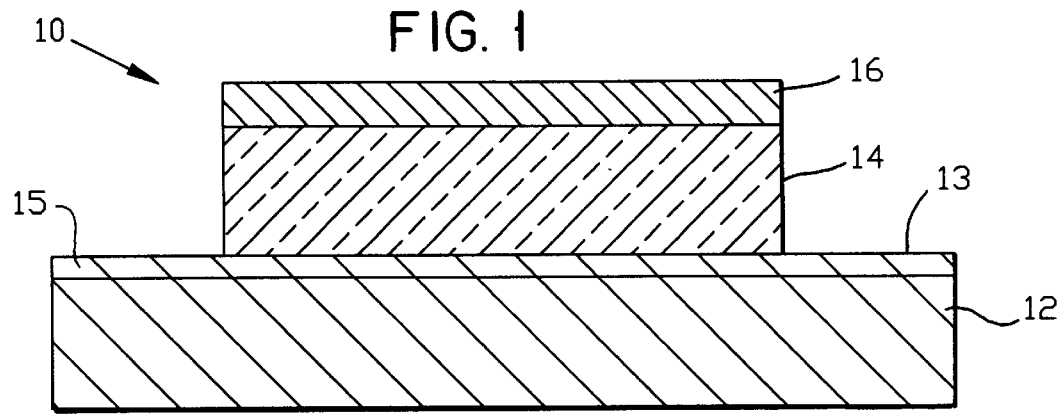
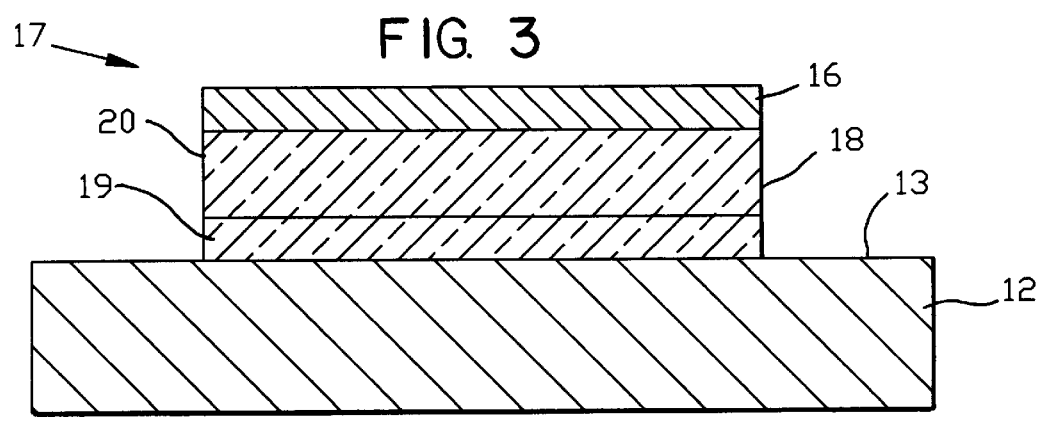
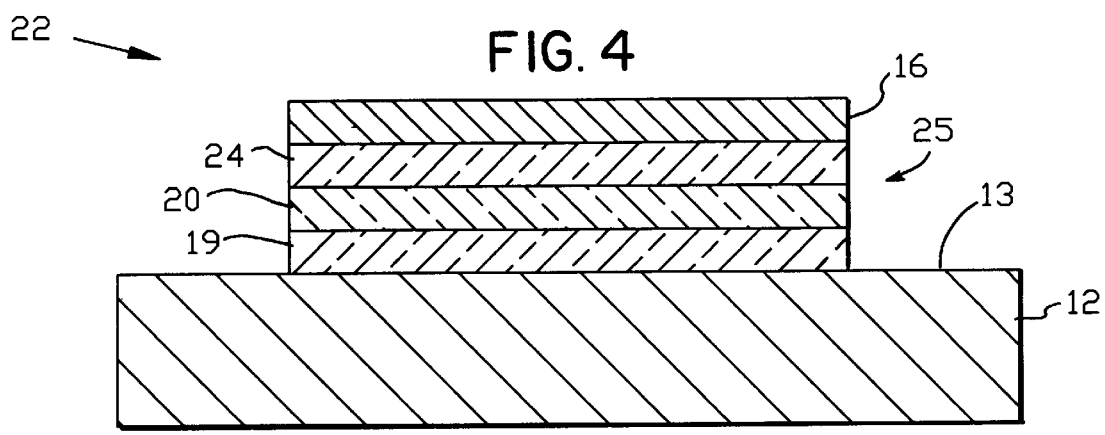

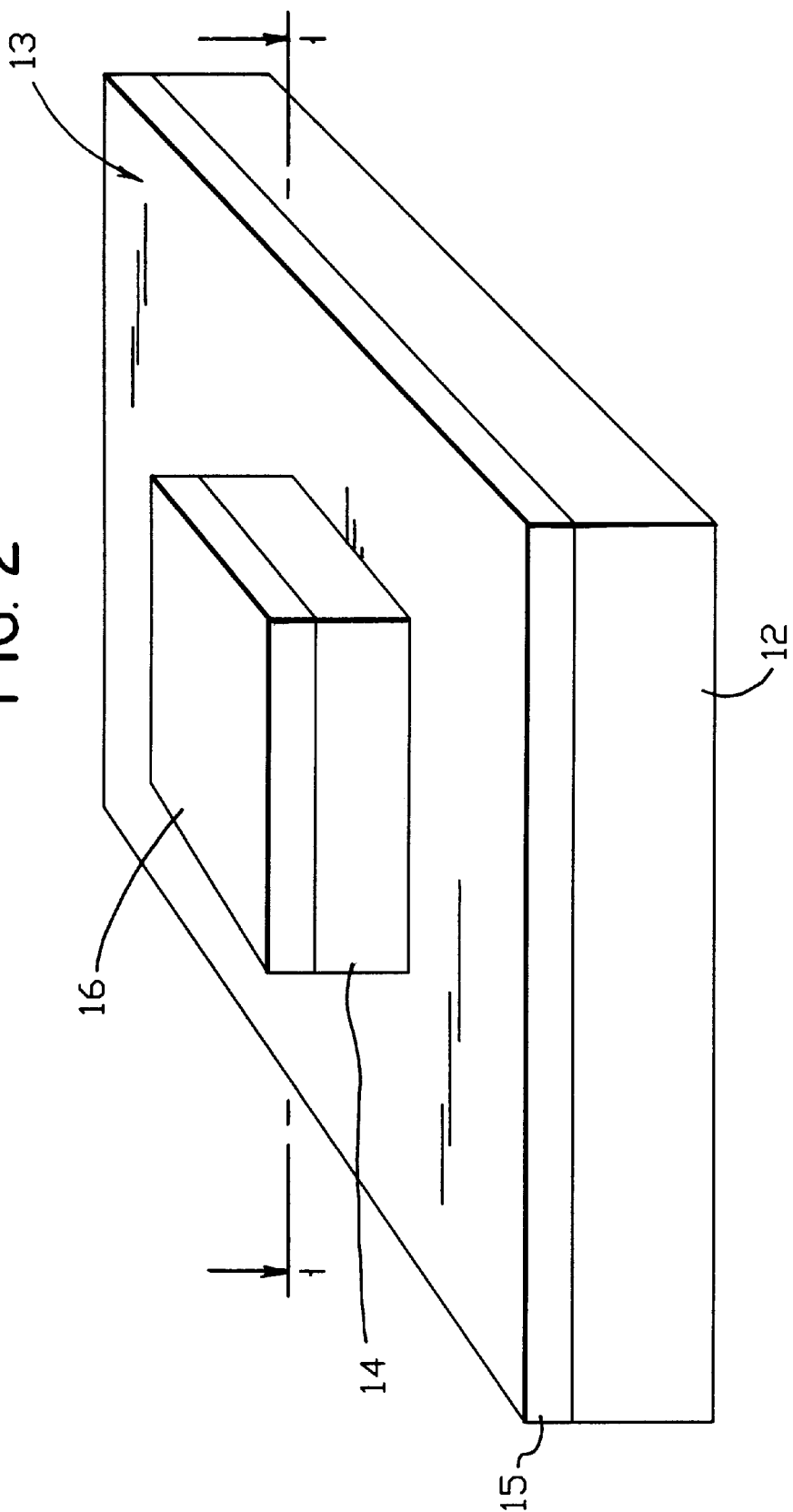

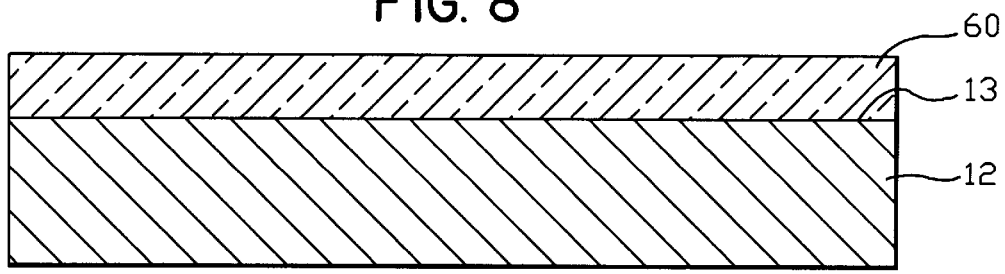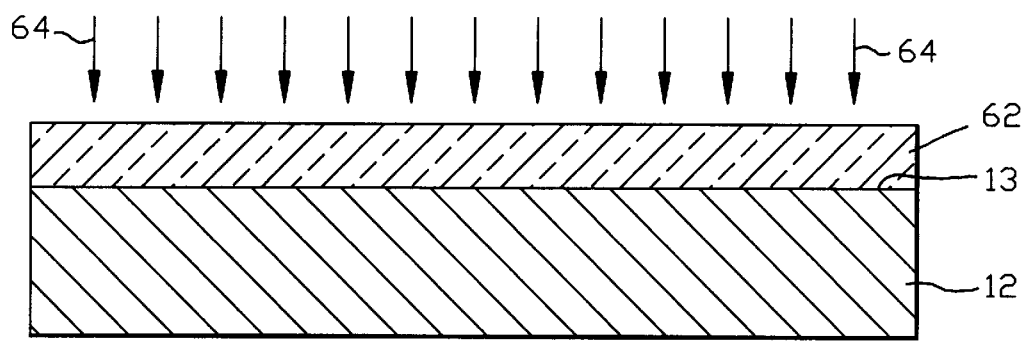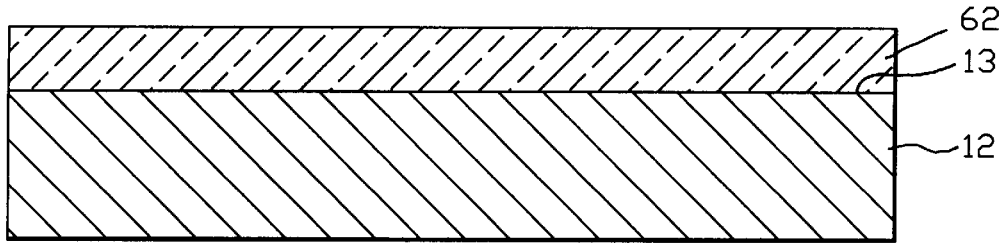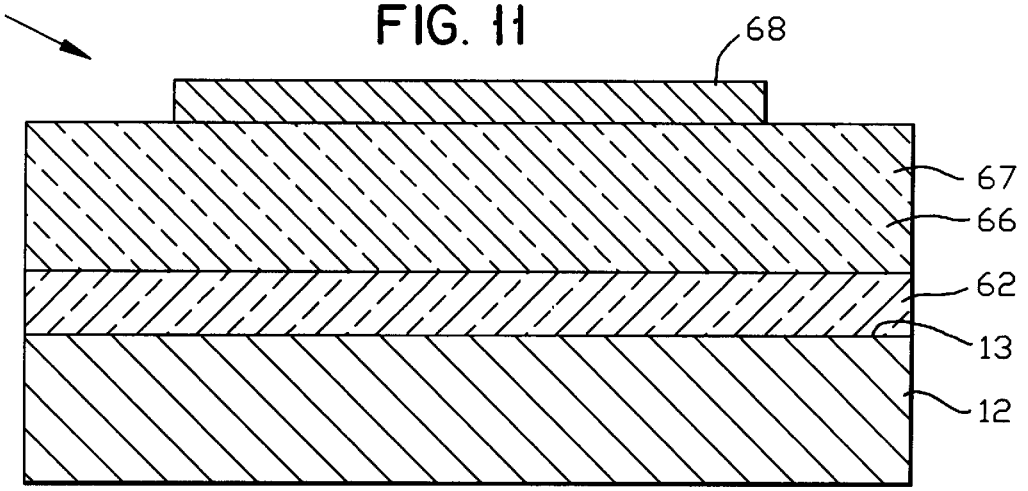

LEAD SILICATE BASED CAPACITOR STRUCTURES

This is a division of application Ser. No. 08/431,349 filed on Apr. 28, 1995 of Robert B. Laibowitz and Thomas McCarroll Shaw.

FIELD OF THE INVENTION

This invention relates to capacitors and more particularly to lead silicate dielectric films for capacitors in dynamic random access memories (DRAM's).

BACKGROUND OF THE INVENTION

Dynamic Random Access Memory (DRAM) integrated circuits or chips are the basis for much of the computer memory applications that are presently used worldwide. These important chips are being fabricated, studied and advanced by many manufacturers. The basic device consists of a transistor and a capacitor with associated read and write connections. Information is stored in the charge state of the capacitor which has to be periodically refreshed due to leakage. The most advanced DRAM circuit under production is the 256 MBit chip which in one version uses a trench capacitor with a silicon oxide-nitride-oxide (O—N—O) sandwich with a dielectric constant of about 4. The dielectric thickness is about 7 nm. The deep trenches are slow and relatively expensive to build and much work is devoted to alternative technologies. In addition future, denser DRAM circuits will require even thinner dielectrics and electron tunneling limits will be approached. A great deal of effort around the world is being devoted to alternate dielectric materials with high dielectric constants and alternate or modified structures. With such developments it is expected that trenches can be avoided.

Many high dielectric constant materials are known and some are being investigated for DRAM application. Even with high dielectric constant materials, dielectric thicknesses less than 100 nm may be anticipated. These materials include strontium titanate (STO) and barium titanate (BTO) and their mixtures. Dielectric constants range from a few hundred to over 800 for films of these well-known materials. Mixtures of lead zirconium titanate (PZT) and lead lanthanum titanate (PLT) are also possible high dielectric materials. When these materials are used, they are generally deposited on a base electrode of Pt.

SUMMARY OF THE INVENTION

In accordance with the present invention, a capacitor and method for making such a capacitor for dynamic randomn access memories and other applications is provided comprising a lower electrode of Si, SiGe, metal or metal silicide for example, a dielectric layer of barium or lead silicate, lead silicate glass or combinations thereof, and a top electrode of metal, silicide or semiconductor for example.

The invention further provides a capacitor having a lower electrode, a first dielectric layer of barium or lead silicate, a second dielectric layer of high dielectric constant material, greater than 50, and a top electrode.

BRIEF DESCRIPTION OF THE DRAWING

These and other features, objects, and advantages of the present invention will become apparent upon consideration of the following detailed description of the invention when read in conjunction with the drawing in which:

FIG. 1 is a cross section view along the lines 1—1 of FIG. 2.

FIG. 2 is a top view of one embodiment of the invention.

FIG. 3 is a cross section view of a first alternate embodiment of the invention.

FIG. 4 is a cross section view of a second alternate embodiment of the invention.

FIGS. 8 and 9 are cross section views illustrating a first process for making.

FIGS. 10 and 11 are cross section views illustrating a second process for making.

DESCRIPTION OF THE PREFERRED EMBODIMENT

Figure 5:
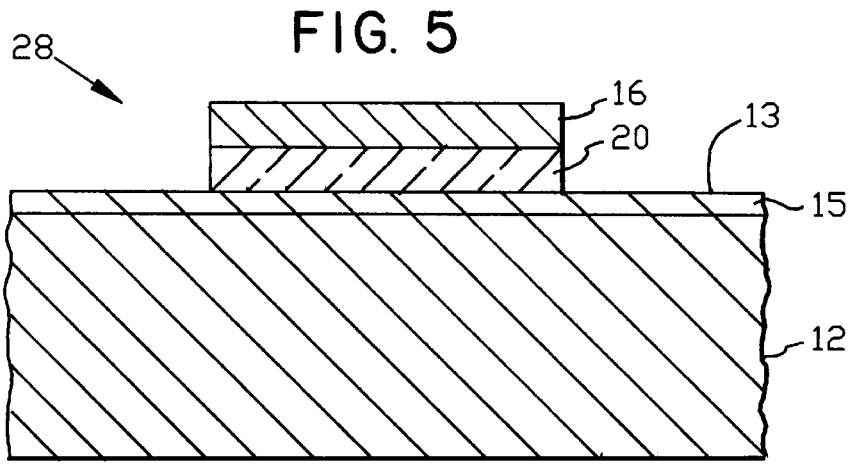
FIG. 5 is a cross section view of a third alternate embodiment of the invention.

Referring to FIGS. 1 and 2 of the drawing, capacitor 10 is shown. FIG. 1 is a cross section view of FIG. 2 along the line 1—1. A substrate 12 may have a conducting layer 15 thereon having an upper surface 13 which may function as the lower electrode of capacitor 10. Alternatively, layer 15 may be deleted and substrate 12 itself may function as the lower electrode of capacitor 10. A dielectric layer 14 comprising lead silicate, lead silicate glass, or a combination thereof is formed on layer 15. A top or counter electrode 16 is formed over dielectric layer 14.

Substrate 12 is generally much thicker than layers 15, 14, and 16 and may be bulk Si, Ge, an alloy of SiGe, silicon-on-insulator (SOI), SiGe-on-insulator, polysilicon or amorphous silicon. Layer 15 may be as thin as a few nm while the thickness of substrate 12 can vary from about 10 nm for the case of a thin film substrate to a few tenths of a mm of silicon chips to a few mm for bulk silicon substrates. Layer 15 and electrode 16 may be or include a metal layer of platinum, conducting alloys of silicon, heavily doped silicon or polysilicon where the doping is greater than $10^{18}$ atoms/cc. Layer 15 or electrode 16 may be conducting due to voltage biasing. Dielectric layer 14 may have a thickness in the range from several nm to about a thousand nm.

FIG. 2 shows a top view of capacitor 10 having layer 15 as the lower electrode and electrode 16 as the top electrode. Electrode 16 may also serve to connect other parts of a circuit and in such practice may be patterned by way of lithographic techniques commonly used for integrated circuit fabrication.

FIG. 3 shows capacitor 17 comprising substrate 12, dielectric layer 18 and top electrode 16. In FIG. 3, like references are used for functions corresponding to the apparatus of FIGS. 1 and 2. Dielectric layer 18 is comprised of a dielectric layer 19 which may be of the same material as dielectric layer 14 and an upper dielectric layer 20 positioned on dielectric layer 18. Dielectric layer 20 comprises a high dielectric material having a dielectric constant greater than 50. Dielectric layer 20 may include one or more of the following materials: barium titanate, strontium titanate, mixtures of barium titanate and strontium titanate, lead lanthanum titanate, tantalates, niobates including $PbBi_2TaNbO_9$, $SrBi_2TaNbO_9$ and $BaBi_2TaNbO_9$ and other high dielectric materials such as described in Patent Document WO93/12542 published Jun. 24, 1993 by C.A. Paz de Araujo which is incorporated herein by reference. In this layered dielectric the total capacitance is that due to the two dielectric layers 19 and 20 in series.

FIG. 4 shows capacitor 22 comprising substrate 12, dielectric layer 25 and top electrode 16. In FIG. 4, like references are used for functions corresponding to the apparatus of FIGS. 1, 2 and 3. Dielectric layer 25 comprises a dielectric layer 19, dielectric layer 20 and dielectric layer 24. Dielectric layer 24 may be the same material as dielectric layer 14. Additional dielectric layers can be added to customize the capacitor.

FIG. 5 shows capacitor 28 comprising substrate 12, layer 15, dielectric layer 20 and top electrode 16. In FIG. 5, like references are used for functions corresponding to the apparatus of FIGS. 1, 2 and 3.

Figure 6:
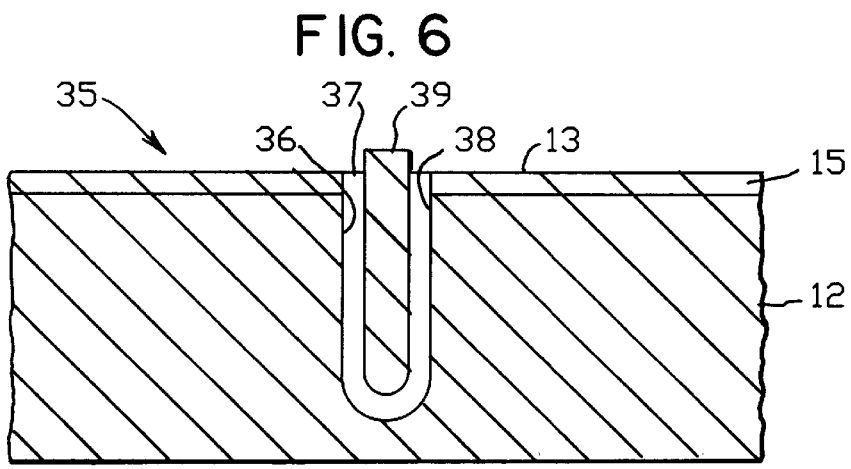
FIG. 6 is a cross section view of a fourth alternate embodiment of the invention.

FIG. 6 shows capacitor 35 comprising substrate 12, trench 36, dielectric layer 37 on trench sidewalls 38 and center electrode 39. In FIG. 6, like references are used for functions corresponding to the apparatus of FIGS. 1–5. Dielectric layer 37 may be one of dielectric layers 14, 18, 20, and 25.

Figure 7:
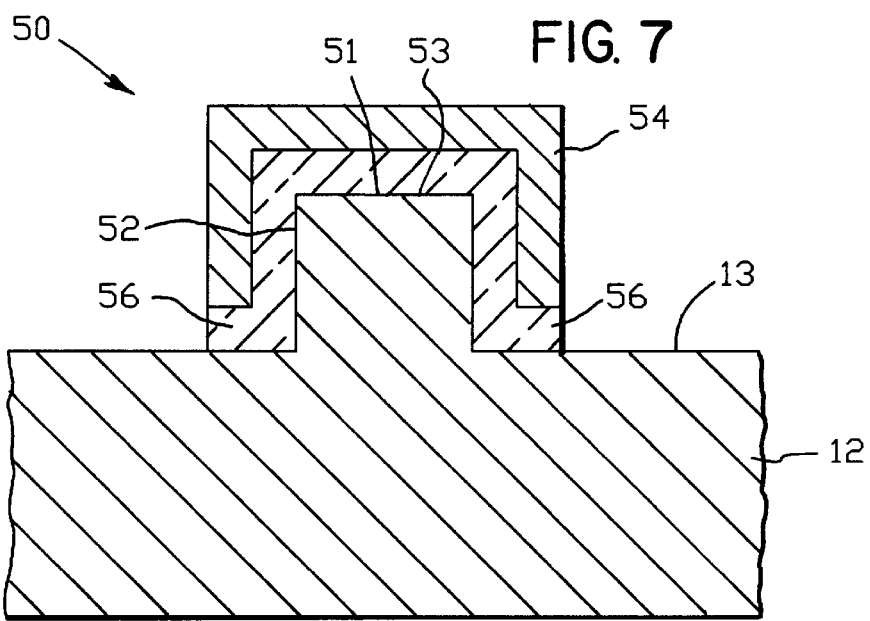
FIG. 7 is a cross section view of a fifth alternate embodiment of the invention.

FIG. 7 shows capacitor 50 comprising substrate 12 having a mesa or stack 51. By having mesa 51, the effective area of the capacitor can be increased over a planar device such as capacitor 10 in FIG. 1 although more processing is needed. Substrate 12 is shown as the base electrode of capacitor 50. Dielectric layer 56 is shown covering the sidewalls 52 and top 53 of mesa 51. Counter electrode 54 covers dielectric layer 56 over the sidewalls 52 and top 53 as shown in FIG. 7. Dielectric layer 56 may be one of dielectric layers 14, 18, 20, and 25.

In the method of forming capacitor 10 shown in FIG. 1, a thin silicon oxide base layer 60 such as silicon dioxide is formed on upper surface 13 of substrate 12 as shown in FIG. 8. A silicon oxide base layer 60 is formed by vapor deposition or by diffusion of silicon from the substrate through upper surface 13 into silicon oxide base layer 60 where the silicon atoms will combine with ambient oxygen to form the thin silicon oxide base layer 60. Next, lead ions may be ion implanted as shown by arrows 64 into the silicon oxide base layer 60 to form lead silicate layer 62. Alternatively, lead atoms may be deposited on the surface of the thin silicon oxide base layer 60. Effective formation of lead silicate layer 62 can be enhanced by a subsequent thermal treatment of lead silicate layer 62.

FIGS. 10 and 11 show the key steps in the formation of a high dielectric constant dielectric layer 67. FIG. 10 shows a substrate with upper surface 13 and with lead silicate film 62 already in place. High dielectric constant material 66 is deposited to form dielectric layer 67 having a predetermined thickness over lead silicate layer 62. A counter electrode 68 is then deposited over dielectric layer 67 and patterned by well known techniques. The high dielectric constant material 66 is taken from the class of perovskite based materials as described above for layers 18 and 20. Other high dielectric constant materials 66 may be such as niobates and tantalates. By depositing high dielectric material on the lead silicate layer 62 the total capacitance is increased over that which would have resulted had the high dielectric constant material 66 been deposited on silicon dioxide as the dielectric constnt of silicon dioxide is about 4 while the lead silicate layer 62 can be as high as 16. As shown in FIG. 11, the thin lead silicate layer 62 also can serve as an atom and ion buffer layer between the high dielectric constant material 66 and layer 15 and substrate 12 below.

Other materials such as barium silicates could also be used in place of the lead silicates and may be useful in particular applications. However, other silicates while they have higher dielectric constants than silicon dioxide have generally lower values than the lead silicates.

While there has been described and illustrated a capacitor and method for making wherein a dielectric layer of lead silicate, barium silicate alone or in combination with layers containing a high dielectric material such as barium titanate, strontium titanate, mixtures thereof, and lead lanthanum titanate (PLT), it swill be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method of forming a capacitor comprising the steps of:

forming a layer of silicon dioxide on a semiconductor substrate, forming a film selected from the steps consisting of evaporating, ion implanting and electroplating a first material selected from the group consisting of barium and lead on the upper surface of said silicon dioxide layer, diffusing atoms of said material into said silicon oxide layer by raising the temperature of said silicon dioxide layer and said film of first material to form a first dielectric layer of a second material selected from the group consisting of a barium silicate, lead silicate and mixtures thereof and mixtures with silicon dioxide, removing the remainder of said film of first material, and forming a top electrode on said first dielectric layer.

2. The method of claim 1 further including the step of forming a second dielectric layer of third material over said first dielectric layer, said third material being a high dielectric constant material greater than 100 deposited by a process selected from the group consisting of sol gel deposition, sputtering and Metal Organic Chemical Vapor Deposition (MOCVD).

3. A method of forming an array of capacitors comprising the steps of:

forming a layer of silicon dioxide on a semiconductor substrate, forming a film selected from the steps consisting of evaporating, ion implanting and electroplating a first material selected from the group consisting of barium and lead on the upper surface of said layer of silicon dioxide, diffusing atoms of said first material into said layer of silicon dioxide to form a first dielectric layer, removing the residual portion of said film of first material on said first dielectric layer, forming a blanket layer of metal over said first dielectric layer, and patterning said metal layer and said first dielectric layer to form said array of capacitors.

* * * * *